(12) United States Patent
Drofenik et al.

(10) Patent No.: US 10,797,586 B2
(45) Date of Patent: Oct. 6, 2020

(54) POWER MODULE BASED ON NORMALLY-ON SEMICONDUCTOR SWITCHES

(71) Applicant: ABB Schweiz AG, Baden (CH)

(72) Inventors: Uwe Drofenik, Zürich (CH); Francisco Canales, Baden-Dättwil (CH); Chunlei Liu, Oberrohrdorf (CH); Franziska Brem, Küsnacht (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/663,868

(22) Filed: Oct. 25, 2019

(65) Prior Publication Data

US 2020/0059155 A1 Feb. 20, 2020

Related U.S. Application Data

(63) Continuation of application No. PCT/EP2018/060227, filed on Apr. 20, 2018.

(30) Foreign Application Priority Data

Apr. 28, 2017 (EP) .................................. 17168611

(51) Int. Cl.
| | | |
|---|---|---|
| *H02M 1/32* | (2007.01) | |
| *H01L 25/065* | (2006.01) | |
| *H03K 17/567* | (2006.01) | |
| *H03K 17/687* | (2006.01) | |

(52) U.S. Cl.
CPC .......... *H02M 1/32* (2013.01); *H01L 25/0657* (2013.01); *H03K 17/567* (2013.01); *H03K 17/687* (2013.01)

(58) Field of Classification Search
CPC ... H01L 25/0657; H02M 1/32; H03K 17/567; H03K 17/687
USPC ......................................... 327/108, 109, 520
See application file for complete search history.

(56) References Cited

U.S. PATENT DOCUMENTS

| | | | |
|---|---|---|---|
| 8,760,214 B2 | 6/2014 | Biela et al. | |
| 8,912,840 B2 | 12/2014 | Aggeler et al. | |
| 9,082,790 B2 | 7/2015 | Bobde et al. | |
| 2011/0267852 A1 | 11/2011 | Asplund | |
| 2012/0262220 A1 | 2/2012 | Igarashi | |
| 2015/0229121 A1 | 8/2015 | Davidson | |
| 2019/0245446 A1* | 8/2019 | Jojima ............... | H02M 3/33507 |

(Continued)

FOREIGN PATENT DOCUMENTS

| | | |
|---|---|---|
| WO | 2013045241 A1 | 4/2013 |
| WO | 2015090428 A1 | 6/2015 |
| WO | 2016062589 A1 | 4/2016 |

OTHER PUBLICATIONS

European Patent Office, International Search Report & Written Opinion issued in corresponding Application No. PCT/EP2018/060227, dated Jun. 20, 2018, 12 pp.

(Continued)

*Primary Examiner* — William Hernandez
(74) *Attorney, Agent, or Firm* — Slater Matsil, LLP (57) ABSTRACT

A power module included a plurality of normally-on semiconductor switches based on a wide bandgap substrate, the normally-on semiconductor switches connected in parallel; and a balancing unit including a capacitor and a balancing semiconductor switch connected in series, which are connected in parallel to the normally-on semiconductor switches.

18 Claims, 3 Drawing Sheets

(56) References Cited

U.S. PATENT DOCUMENTS

2019/0245456 A1* 8/2019 Sawada ................ B60L 50/51
2019/0304882 A1* 10/2019 Hong ................ H01L 23/49575

OTHER PUBLICATIONS

Kokosis et al., "Forced Current Balancing of Parallel-Connected SiC JFETs During Forward and Reverse Conduction Mode," IEEE Transactions on Power Electronics, vol. 32, No. 2, Feb. 2017, pp. 1400-1410.

I. A. Gowaid, G. P. Adam, Ahmed M. Massoud, Shehab Ahmed, Derrick Holliday, B. W. Williams, "Quasi Two-Level Operation of Modular Multilevel Converter for Use in a High-Power DC Transformer With DC Fault Isolation Capability", IEEE Transactions on Power Electronics, vol. 30, No. 1, Jan. 2015.

I. A. Gowaid, G. P. Adam, Shehab Ahmed, Derrick Holliday, B. W. Williams, "Analysis and Design of a Modular Multilevel Converter with Trapezoidal Modulation for Medium and High Voltage DC-DC Transformers", IEEE Transactions on Power Electronics, 2014.

J. Biela, et al., "Balancing circuit for a 5kV/5Ons pulsed power switch based on SiC-JFET Super Cascode," in 2012 IEEE 2012, pp. 635-640.

W. Bergner, et al., "Infineon's 1200V SiC JFET—The New Way of Efficient and Reliable High Voltages Switching."

D. Peftitsis, et al., "High-Power Modular Multilevel Converters With SiC JFETs," IEEE Transactions on Power Electronics, vol. 27, pp. 28-36, 2012.

ABB, "StakPak: IGBT press-pack modules," 2015.

\* cited by examiner

POWER MODULE BASED ON NORMALLY-ON SEMICONDUCTOR SWITCHES

FIELD OF THE INVENTION

The invention relates to the field of high voltage power converters. In particular, the invention relates to a power module and a power module stack, a use of the power module and a method for operating the power module.

BACKGROUND OF THE INVENTION

For high voltage applications, the blocking voltage of one semiconductor switch may not be high enough to block the high voltage processed by the power converter. When series-connecting semiconductor switches, the blocking voltage capability of the resulting switch is increased.

Higher blocking voltages of semiconductor switches may allow simplified structures of converter topologies which may have potential to reduce system complexity, reduce cost and increase reliability. For example, in modular multilevel converter topologies like high-voltage DC (HVDC) applications with a large number of power modules, a doubling of the blocking voltage of one power module may reduce the number of power modules by half, which may simplify the system complexity significantly. Analogously, in multilevel medium voltage drives, it may be possible to replace a 3-level topology by a 2-level topology.

SiC and other wide bandgap material switches allow high blocking voltages at low switching losses. Therefore, they may be well suited for medium- and high-voltage applications like HVDC or medium voltage drives. However, besides issues with dynamic and static voltage balancing, there may be issues in case of a chip failure.

In power modules with Si IGBT semiconductor switches a short-circuit failure-mode (SCFM) is available, which is provided by a metal pad directly connected to each Si-IGBT semiconductor switch. In the case of a chip failure, the metal pad and the Si substrate of the semiconductor switch form together an electrically conducting alloy.

For SiC semiconductor switches and other wide bandgap materials switches, this melting process may not be controlled in a reliable way, so that a single chip failure may disable not only the semiconductor switch, but the whole converter.

WO2015 090 428 A1 relates to a method of handling a failed semiconductor switching module of a converter cell. The converter cell comprises a plurality of semiconductor switching modules and a cell capacitor, each semiconductor switching module having a short circuit failure mode and comprising a number of semiconductor submodules controllable by a gate unit and a kill switch.

Kokokis Sotirios et. al. "Forced Current Balancing of Parallel-Connected SiC JFETs During Forward and Reverse Conduction Mode", IEEE Transactions on power electronics, Institute of electrical and electronics engineers, USA, vol. 32, no. 2, shows in FIG. 6(a) two paralleled SiC JFETs, which are arranged in a test circuit. The JFETs are connected in parallel with a switch and a capacitor. For testing the parallel connection of the JFETs, a current is generated in an inductor, which current is then applied to the JFETs.

US 2011/267852 A relates to fault protection in a converter with redundant switching cells. A press-pack arrangement is shown with switches that may be IGBTs or GTOs.

DESCRIPTION OF THE INVENTION

It is the objective of the invention to provide reliable converter topologies, which needs only few maintenance and which may be used in combination with wide bandgap semiconductor devices.

This objective is achieved by the subject-matter of the independent claims. Further exemplary embodiments are evident from the dependent claims and the following description.

A first aspect of the invention relates to a power module. A power module may be any device composed of one or more semiconductor chips, their electrical and mechanical interconnections and a housing for these components. The term "power" here and in the following may refer to modules and/or semiconductor switches adapted for processing current of more than 100 V and/or more than 10 A.

According to an embodiment of the invention, the power module comprises a plurality of normally-on semiconductor switches based on a wide-bandgap substrate, which switches are connected in parallel. Each semiconductor switch may be provided in a semiconductor chip, which is made of the wide bandgap substrate. For example, the normally-on semiconductor switches may be based on a SiC substrate. Also, the normally-on semiconductor switches may have blocking capability of more than 10 kV.

A normally-on semiconductor switch may be a semiconductor switch, which is conducting or is turned on, when no gate signal or a gate signal of substantially 0 V is applied to its gate. A normally-on semiconductor switch becomes blocking or is turned off, when a voltage different from 0 is applied to its gate. For example, a normally-on semiconductor switches may be a JFET, i.e. junction gate field-effect transistor. Contrary to this, a normally-off semiconductor switch may be a semiconductor switch, which is blocking or is turned off, when no gate signal or a gate signal of substantially 0V is applied to its gate.

For example, the normally-on semiconductor switches may be SiC JFETs. SiC JFETs may be seen as the most mature SiC switching devices. They may have a simpler structure than other switching devices, such as MOSFET, IGBT, and there may be no gate oxide degradation issues in SiC JFETs. Furthermore, SiC JFETs may be easily paralleled, due to their positive temperature coefficient, which may result in higher current capability.

A power module containing parallel connected normally-on wide bandgap material semiconductor switches, which carry the nominal current of the power module, on the one hand may provide a higher blocking voltage as a power module based on Si semiconductor switches and on the other hand may provide an intrinsic failure mode in the case of a short circuit. Such a short circuit may connect the gate of the failed semiconductor switch to its source, resulting in a gate-source-voltage of 0 V. When all gates of the parallel normally-on semiconductor switches are connected to the same gate control line, they all will have a gate-source-voltage of 0 V, too, and all will become permanently conducting.

Furthermore, if one of the normally-on semiconductor switches fails, often this may destruct the complete gate connection of the power module, and all other normally-on semiconductor switches become permanently conducting.

In such a way, when the power module is used in series connection with equally designed power modules, the power module is bridged, if one of its switches has a failure. Such a power module does not require a melting process, as in a power module with normally-off semiconductor switches based on Si substrate, to keep a converter, composed of these power modules, operating. A mechanical bypass switch may become obsolete and/or costs may be reduced due to better control of the failure.

Additionally, due to the employment of SiC normally-on semiconductor switches, the footprint of the power module may be significantly reduced and the power density may be increased. In general, wide bandgap or SiC semiconductor switches may lead to the reduction of the cooling requirements, may result in a low on state resistance, which may result in low conduction losses and higher system efficiency. Furthermore, there may be a lower risk of cooler damage as there is less chance of arcing or explosion during or after a failure.

According to an embodiment of the invention, the power module further comprises a balancing unit comprising a capacitor and a balancing semiconductor switch connected in series, which are connected in parallel to the normally-on semiconductor switches. The capacitor and normally-off semiconductor switch may be responsible for a voltage balancing of stacked power modules.

The balancing semiconductor switch and/or the capacitor may have a lower voltage rating and or current rating as the normally on power semiconductor switches. The balancing semiconductor switch and/or the capacitor may experience not the main current, but only current peaks at switching times which may mean that the balancing semiconductor switch may handle significantly less averaged current as compared to the normally-on semiconductor switches. The capacitor is responsible for the voltage balancing, but does not experience the main current.

For example, the balancing semiconductor switch may be a normally-off semiconductor switch and/or may be based on a Si substrate. The balancing semiconductor switch may be an IGBT, such as a Si IGBT. Alternatively, the balancing semiconductor switch may be a MOSFET, such as a Si MOSFET, or a JFET, such as a Si JFET.

Since the balancing unit may take care of the voltage balancing, it may not be necessary to preselect the chips and/or semiconductor switches for the power module in order to only employ chips with electrical characteristics that are very close to each other. Omitting this specific pre-selection process may help reducing costs.

According to an embodiment of the invention, no inductor is connected in parallel with the plurality of normally-on semiconductor switches and with the capacitor and the balancing semiconductor switch connected in series. Only the normally-on semiconductor switches may be provided with the balancing voltage from the capacitor.

According to an embodiment of the invention, solely the plurality of normally-on semiconductor switches and the capacitor and the balancing semiconductor switch connected in series are connected in parallel. No further electric and/or electronic components, in particular those adapted for permanently conducting a load current through the normally-on semiconductor switches, should be connected in parallel to the normally-on semiconductor switches and the balancing unit. According to an embodiment of the invention, the power module comprises a controller adapted for providing a gate signal for the normally-on semiconductor switches. The controller may control all normally-on semiconductor switches with only one signal. Usually, the controller may receive control signals from a superordinated controller, which controls the converter, the power module is a component of.

Additionally, one or more sensors for detecting a short circuit failure in the power module may be provided in the power module and/or may be interconnected with the controller, which is adapted for detecting such a failure. Furthermore, the controller may be adapted for applying a turn-off gate signal to the normally-on semiconductor switches in the case of a detected failure.

As described above, when a short circuit failure destroys the gate connection and/or even the gate controller, all semiconductor switches of the power module become conducting and will bridge the power module. This may be seen as an intrinsic or passive failure mode. If this is not the case, the controller may detect the short circuit and may apply a gate signal of 0 V to all normally-on semiconductor switches of the power module, such they all become conducting. This may be seen as an extrinsic or active failure mode. With such a power module no short circuit failure mode based on melting is required in order to keep converter operating. This may enable a longer lifetime after a chip failure.

According to an embodiment of the invention, the controller is adapted for providing a gate signal for the balancing semiconductor switch. Also, the balancing unit may be controlled by the same controller as the normally-on semiconductor switches.

According to an embodiment of the invention, the controller is adapted for turning the normally-on semiconductor switches on and off with a given switching frequency. The switching frequency or an accordingly modulated signal may be provided to the controller. In other words, the normally-on semiconductor switches are turned on and off regularly and/or after uniform time intervals.

According to an embodiment of the invention, the controller is adapted for turning off the balancing semiconductor switch, when the normally-on semiconductor switches are turned on and and for turning on the balancing semiconductor switch, when the normally-on semiconductor switches are turned off. Usually, the balancing semiconductor switch is controlled in a reverse way with respect to the normally-on semiconductor switches. In such a way, the capacitor may keep its voltage, when the normally-on semiconductor switches are switched in the conducting state. When the normally on semiconductor switches are switched in the blocking state, that capacitor is connected in parallel to them and balances the voltage applied to them.

According to an embodiment of the invention, the given switching frequency with which the normally-on semiconductor switches and the balancing semiconductor switch are turned on and off, is higher than 50 Hz, for example higher than 500 Hz. The power module may be used for switching an AC current.

According to an embodiment of the invention, a time interval between turning off the balancing semiconductor switch and turning on the normally-on semiconductor switches is smaller than 1 µs. accordingly, a time interval between turning off the normally-on semiconductor switches and turning on the balancing semiconductor switch is smaller than for example smaller than 100 ns. The time intervals, between conducting states of the normally-on semiconductor switches and the balancing semiconductor switch, in which both the normally-on semiconductor switches and the balancing semiconductor switch are blocking may be short. In particular, these time intervals may be shorter (such as at least 10 times) than a period of the switching frequency. According to an embodiment of the invention, the controller is mechanically integrated in the power module. Mechanically integrated may mean that the circuitry of the controller is provided inside a housing of the power module and/or is attached to a housing and/or a frame of the power module.

In general, the voltage balancing switch may be driven by a different gate driver as the gate driver for the normally-on semiconductor switches. However, both gate drivers may be provided on the same printed circuit board. This printed circuit board may be integrated into the power module.

Furthermore, the balancing unit may be provided on a printed circuit board, which also may be integrated in the power module. For example, the controller and the balancing unit may be provided by the same printed circuit board or by different printed circuit boards. Depending on the size of the capacitor for the balancing unit, there may be the option to integrate the printed circuit board in an additional pocket and/or cavity in the module frame or to connect it directly outside to the frame.

According to an embodiment of the invention, all gates of the normally-on semiconductor switches are electrically connected with each other for receiving a single gate signal from a controller. In other words, the power module may have a single gate control line, which may be connected to a controller. As already mentioned above, a single gate control line may be connected to the source side of the power module in the case of a short circuit of one of the normally-on semiconductor switches. The source side of the power module may be an electrical conductor to which the sources of the normally-on semiconductor switches are electrically connected. According to an embodiment of the invention, the power module comprises a base plate to which the normally-on semiconductor switches are bonded and a top plate to which for each normally-on semiconductor switch an electrically conducting spring element is attached, which presses against the respective normally-on semiconductor switch. The power module may be an assembly with spring elements to press electrical contacts against the normally-on semiconductor switches. For example, the normally-on semiconductor switches may be assembled into submodules and the submodules may be arranged in a frame of the power module. The frame may be clamped between cooling plates.

However, it is also possible that the normally on semiconductor switches are sandwiched between a baseplate and a top plate without spring elements.

According to an embodiment of the invention, the power module further comprises an auxiliary unit for providing auxiliary power to the controller. The auxiliary unit may be seen as an auxiliary power supply for the power module and/or for its controller.

Usually, if a converter employing normally-off switches, such as IGBTs, MOSFETs, IGCT, etc., is powered up, the DC link capacitors are charged, and an auxiliary unit draws current from there. Such an auxiliary unit starts supplying gate drivers, control and sensors, the normally-off switches start switching and the converter goes into operation.

However, in case of converters with normally-on semiconductor switches like JFETs as employed in the power module proposed herein, the normally-on semiconductor switches usually need to be operated already before connecting the converter to the grid. Otherwise, the normally-on semiconductor switches would short-circuit capacitors at the very beginning and, besides shorting the grid, would prevent powering-up of further auxiliaries and the converter itself. Therefore, an energy storage, such as a capacitor of the auxiliary unit may have to be pre-charged or at least partly pre-charged before connecting the converter to the grid. Furthermore, the pre-charging may have to be done with a device galvanically isolated from the power module and/or the auxiliary unit, which may be on the potential of the power module.

According to an embodiment of the invention, the auxiliary unit comprises a battery for providing power to the controller in the case of a start-up of the power module. The battery may be rechargeable and may be recharged during the operation of the power module, for example from a cell capacitor and/or the capacitor of the balancing unit. This solves the problem of galvanic isolation, but may require some logistic and/or maintenance effort to exchange empty batteries on a regular base, especially in case the number of power modules of the converter is large.

According to an embodiment of the invention, the auxiliary unit comprises an inductive power supply for providing power to the controller in the case of a start-up of the power module. For example, the auxiliary unit may comprise a transformer with a primary winding provided in the power module and a secondary winding galvanically isolated from the power module. The secondary winding may be part of a charging unit that may have to be isolated to the full system voltage.

It also may be, that the secondary winding and/or the charging unit is moved with an actuator towards the primary winding in the power module for pre-charging and after that is moved away from it. In such a way, the auxiliary unit may comprise a movable inductive charging unit. The power transfer unit may have a charging unit, which may be moved close to the receiving element of the auxiliary unit for pre-charging. Before connecting the converter to the grid, the charging unit may have to be moved out of the insulating area.

The auxiliary unit, such as the primary winding, a rectifier and/or a small converter may be integrated into the power module. For example, the auxiliary unit may be provided on the same printed circuit board as the controller and/or the balancing unit.

A further aspect of the invention relates to a power module stack, which comprises at least two power modules as described in the above and in the following, which are connected in series. For example, the power module stack may be a part of an electrical converter. The power module stack may be seen as a switch of the electrical converter, in the case all power modules and all normally-on semiconductor switches of the stack are switched simultaneously.

The power modules in the stack may be connected in series by attaching a top plate of one power module to the base plate of the next power module. It has to be noted, that two, three, four or more power modules may be connected in series to form a power module stack.

It has to be understood that features of the power module stack as described in the above and in the following may be features of the power module as described in the above and in the following, and vice versa.

A further aspect of the invention relates to a use of a power module, for example as described in the above and in the following, for switching a current in a converter. The power module may comprise a plurality of normally-on semiconductor switches based on a wide bandgap substrate, the normally-on semiconductor switches connected in parallel; and a balancing unit comprising a capacitor and a balancing semiconductor switch connected in series, which are connected in parallel to the normally-on semiconductor switches.

A further aspect of the invention relates to a method for controlling a power module, for example as described in the above and in the following. The power module may comprise a plurality of normally-on semiconductor switches based on a wide bandgap substrate, the normally-on semiconductor switches connected in parallel; and a balancing unit comprising a capacitor and a balancing semiconductor switch connected in series, which are connected in parallel to the normally-on semiconductor switches.

According to an embodiment of the invention, the method comprises: turning the normally-on semiconductor switches on and off with a given switching frequency; and turning off the balancing semiconductor switch, when the normally-on semiconductor switches are turned on and turning on the balancing semiconductor switch, when the normally-on semiconductor switches are turned off.

These and other aspects of the invention will be apparent from and elucidated with reference to the embodiments described hereinafter.

BRIEF DESCRIPTION OF THE DRAWINGS

The subject matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
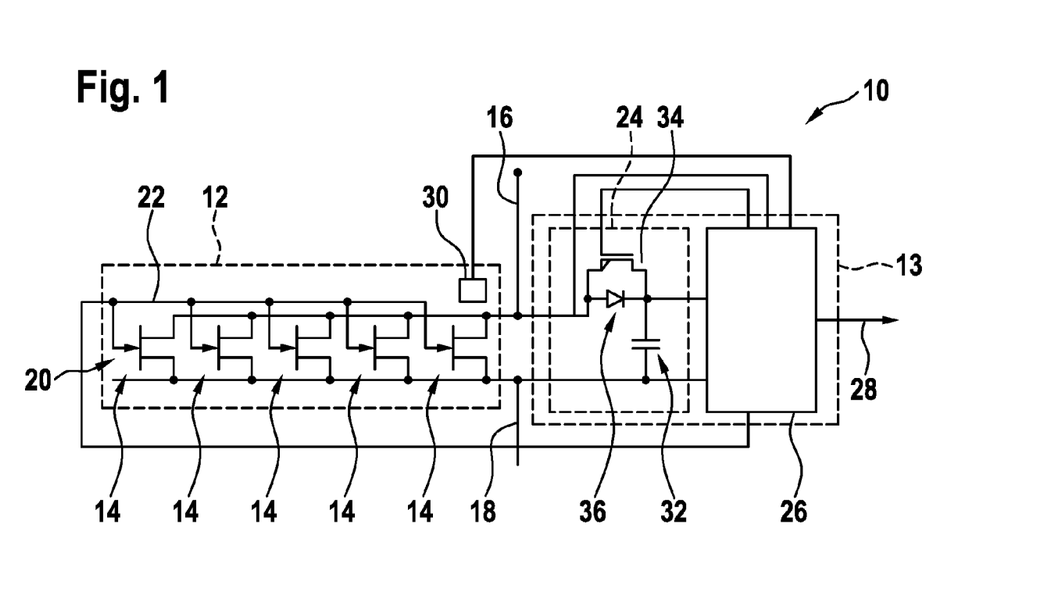
FIG. 1 schematically shows a power module according to an embodiment of the invention.

FIG. 1 shows a power module 10 composed of a power switch submodule 12 and a control and auxiliary submodule 13.

The submodule 12 comprises a plurality of normally-on semiconductor switches 14 connected in parallel between a DC+ terminal 16 and a DC− terminal 18. In the present case, the normally-on semiconductor switches 14 are JFETs based on a SiC substrate. Additionally, the gates 20 of all normally-on semiconductor switches 14 are connected to one gate control line 22.

In the case of a short circuit of one of the normally-on semiconductor switches 14, the respective gate 20 of the switch 14 may be connected to the source and drain of the switch 14, which are short-circuited. Due to the common gate control line 22, all the other normally-on semiconductor switches 14 are also connected to this potential and are then switched into a turned-on state. Furthermore, when the gate control line 22 is damaged by the short circuit and no gate signal can be conducted to the switches 14, they also stay in the turned-on state and completely short circuit the submodule 12. This may provide a passive, intrinsic short circuit failure mode for the power switch submodule 12.

The auxiliary submodule 13 comprises a balancing unit 24 and a controller 26.

The controller 26 is interconnected with the gate control line 22 and adapted for generating a gate signal for all switches 14. I.e. the controller 26 may comprise the gate unit of the power module 10. Switching signals from a superordinated controller of a converter, the power module 10 is a part of, may be provided via an external control line 28.

Optionally, in the power module 10 and/or the submodule 12 a sensor 30 may be arranged, which is adapted for detecting a short circuit. Such a sensor 30 may be an electrically sensor measuring currents and/or voltages in the submodule 12, may be a light sensor adapted for measuring a lighting inside the submodule 12, may be a sound sensor for measuring sounds generated by a short circuit, etc. Any sensor principle is possible. The sensor 30 may be interconnected with the controller 26, which then may be adapted for detecting a short circuit in the submodule 12 based on the sensor signals. In the case of a short circuit, the controller 26 may generate a gate signal for the switches 14, which turns them all off. This may be seen as an active, extrinsic short circuit failure mode of the power module 10.

The balancing unit 24 comprises a capacitor 32 connected in series with a balancing switch 34, which may be a normally-off semiconductor switch, such as a Si IGBT. The current rating and/or voltage rating of the balancing switch 34 may be much smaller, such that by a factor of more than 5, than the current rating and/or voltage rating of the switches 14. A free-wheeling diode 36 may be connected anti-parallel to the switch 34. The series connection of switch 34 and capacitor 32 is connected in parallel to the switches 14 and/or the submodule 12.

The controller 26 is adapted for controlling the switch 34 and/or for measuring the voltage across the capacitor 32, which may be used for supplying the controller 26 with auxiliary power.

The balancing unit 24 and the controller 26 may be provided on a common printed circuit board of the submodule 13.

Figure 2:
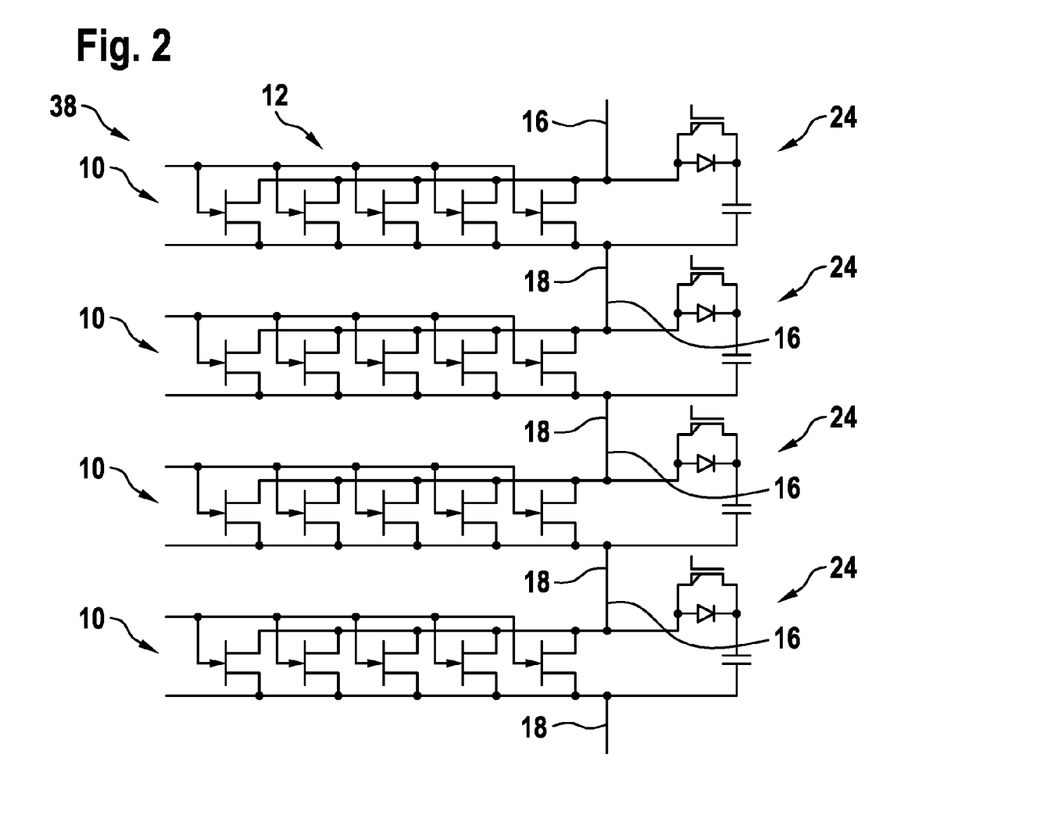
FIG. 2 schematically shows a circuit diagram for a power module stack according to an embodiment of the invention.

With reference to FIG. 2, the balancing unit 24 is used for balancing module voltages of a stack 38 of power modules 10 connected in series. Such a stack 38 may be used as high voltage switch inside a converter, such as an arm of a rectifier, etc. In such a series connecting of power modules 10, the blocking voltage of the switches 14, which is the blocking voltage of one module 10, sums up to a blocking voltage, which is the sum of the blocking voltages of all power modules 10.

For balancing the voltage of the power modules 10, the controller 26 is adapted for switching the balancing switch 34 anticyclical with respect to the normally-on switches 14. In the case, the switches 14 are to be turned on, the capacitor 32 provides a voltage to the switches 14, which is substantially the nominal module voltage, i.e. the voltage applied to the stack 38 divided by the number of power modules 10. Although, if one of the modules 10 switches a bit early into the conducting state, only voltage of the capacitor is applied to the switches 14. After the switching, when the switches 14 are conducting, the balancing switch 34 is immediately turned off, such that the capacitor 32 is not discharged.

When the switches 14 of a power module 10 are turned off, the balancing switch 34 is again turned on to charge the capacitor 34.

Figure 3A:
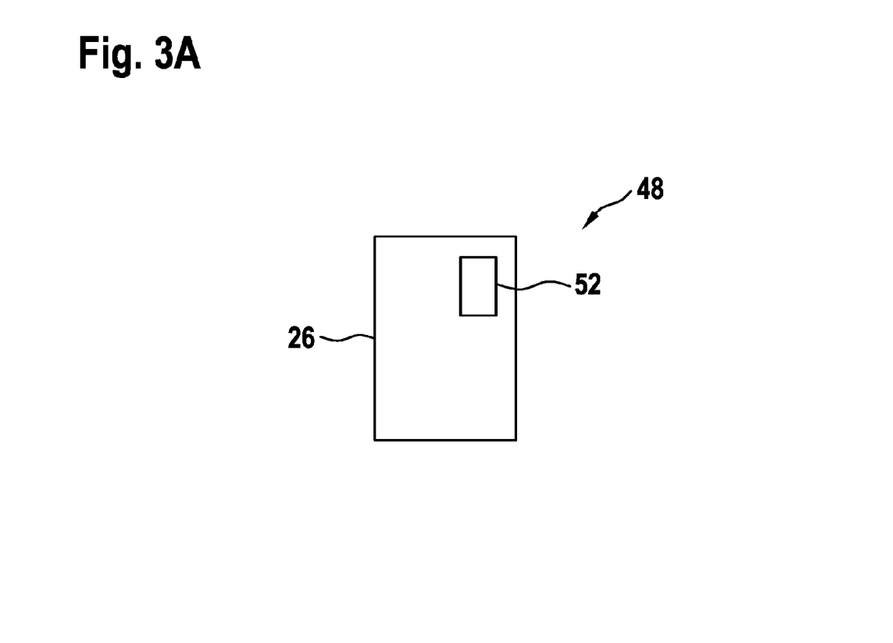
FIGS. 3A and 3B schematically show embodiments of controllers for a power module according to an embodiment of the invention.
Figure 3B:
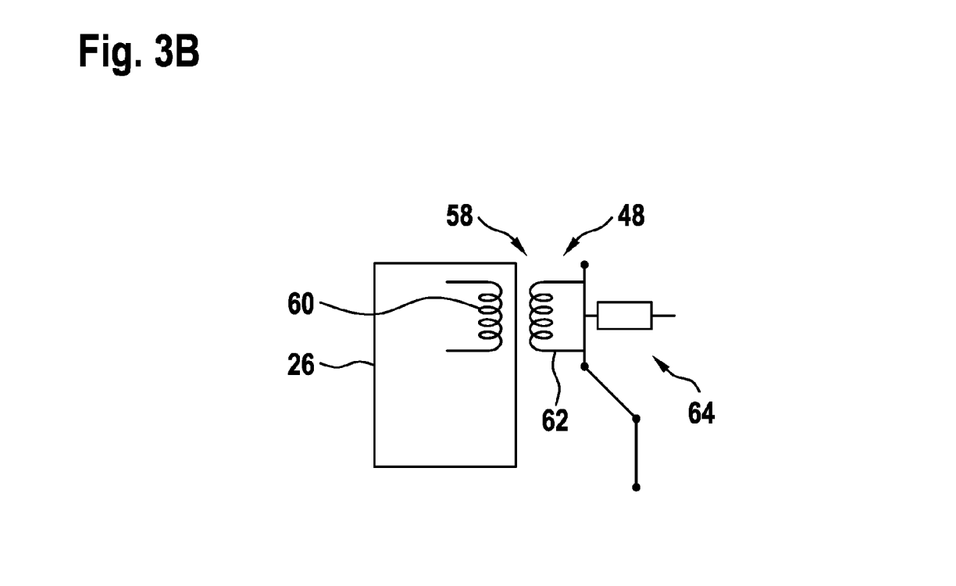

FIGS. 3A and 3B show embodiments of controllers 26, with different auxiliary units 48, which are adapted for providing auxiliary power to the power module 10 in the case of start-up of the power module 10. Since the normally-on semiconductor switches 14 have to be switched in the blocking state, before the capacitor 32 of the power module 10 and/or more general capacitors of a converter with the power module 10 can be charged. The controller 10 has to be supplied with energy, before power may be provided by such capacitors. As the auxiliary unit 48 may have components in the controller 26, which may later be on the potential of the power module 10, these components may have to be galvanically separated from the rest of the converter.

As shown in FIG. 3A, the auxiliary unit 48 may comprise a battery 52, which, for example, may be charged during operation of the power module 10. However, the battery 52 also may be a none-rechargeable battery.

FIG. 3B shows that the auxiliary unit 48 may be based on a transformer 58, with a primary winding 60 in the controller 26 and a secondary winding 62, which is movable towards the primary winding 60 with an actuator 64 during start-up of the power module. For galvanic separation, the secondary winding 62 may be moved away from the primary winding later.

Figure 4:
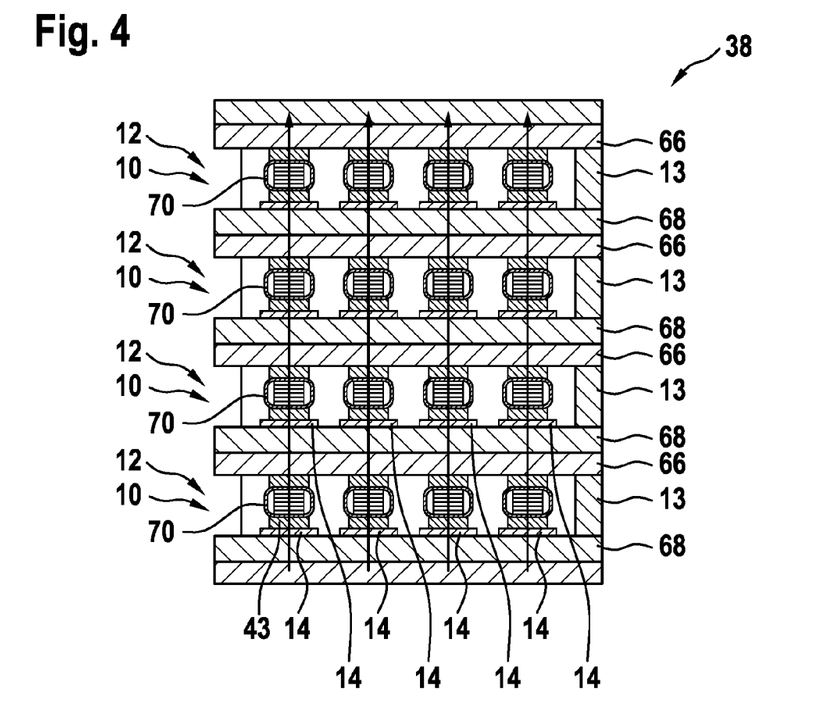
FIG. 4 schematically shows a cross-sectional view of a power module stack according to an embodiment of the invention.
Figure 5:
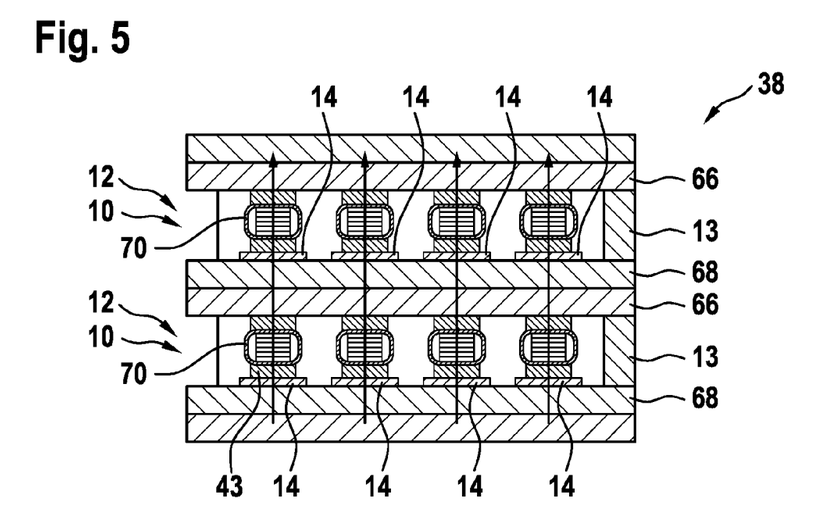
FIG. 5 schematically shows a cross-sectional view of a power module stack according to a further embodiment of the invention.

FIGS. 4 and 5 show mechanical setups of a stack 38 of power modules 10 as described before. Each power module 10 may comprise a top plate 66 and a base plate 68, between which the switches 14 are sandwiched. The stack 38 is assembled by stacking the power modules with its base plate 68 onto the top plate 66 of the previous power module 10.

The power modules 10 and/or the submodules 12 may be equally designed. The switches 14 may be bonded to the base plate 68. For each switch 14 a spring element 70 may be attached to the top plate 66, which is pressed against the respective switch 14 for providing a reliable electrical connection. However, it is also possible that the switches 14 are assembled between the plates 66, 68 without a spring element and/or may be bonded to both plates 66, 68.

FIGS. 4 and 5 show that a stack 38 may be formed of two, four or in general a plurality of power modules 10 with normally-on semiconductor switches 14. Such power modules 10 may be designed like the one shown in FIGS. 1 and 2.

Furthermore, the submodule 13 of a power module 10 may be integrated into the submodule 12. As described above the submodule 13 may comprise the controller 26 of the respective power module 10 and optionally the balancing unit 24. The submodule 13 may be integrated into a pocket or cavity inside the power module 10, for example, between the top plate 66 and the base plate 68.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 power module
12 power switch submodule
13 control and auxiliary submodule
14 normally-on semiconductor switch
16 DC+ terminal
18 DC− terminal
20 gate
22 gate control line
24 balancing unit
26 controller
28 external control line
30 sensor
32 balancing capacitor
34 balancing switch
36 free-wheeling diode
38 power module stack
48 auxiliary unit
52 battery
58 transformer
60 primary winding
62 secondary winding
64 actuator
66 top plate
68 base plate
70 spring element

The invention claimed is:

1. A power module, comprising:
a plurality of normally-on semiconductor switches based on a wide bandgap substrate, the normally-on semiconductor switches connected in parallel;
a balancing unit comprising a capacitor and a balancing semiconductor switch connected in series, which are connected in parallel to the normally-on semiconductor switches;
a controller adapted for providing a gate signal for the normally-on semiconductor switches and for providing a gate signal for the balancing semiconductor switch;
wherein the controller is adapted for turning the normally-on semiconductor switches on and off with a given switching frequency;
wherein the controller is adapted for turning off the balancing semiconductor switch, when the normally-on semiconductor switches are turned on and for turning on the balancing semiconductor switch, when the normally-on semiconductor switches are turned off.

2. The power module of claim 1,
wherein the given switching frequency is higher than 50 Hz;
wherein a time interval between turning off the balancing semiconductor switch and turning on the normally-on semiconductor switches is smaller than 1 µs;
wherein a time interval between turning off the normally-on semiconductor switches and turning on the balancing semiconductor switch is smaller than 1 µs.

3. The power module of claim 2,
wherein the controller is mechanically integrated in the power module.

4. The power module of claim 3, wherein the normally-on semiconductor switches are based on a SIC substrate; and
wherein the normally-on semiconductor switches are JFETs.

5. The power module of claim 2, wherein the normally-on semiconductor switches are based on a SiC substrate; and
wherein the normally-on semiconductor switches are JFETs.

6. The power module of claim 2,
wherein the balancing semiconductor switch is a normally-off semiconductor switch.

7. The power module of claim 6, wherein the balancing semiconductor switch is based on a Si substrate; and
wherein the balancing semiconductor switch is an IGBT, a MOSFET or a JFET.

8. The power module claim 2, wherein the normally-on semiconductor switches comprises gates, all of which gates are electrically connected with each other for receiving a single gate signal from the controller.

9. The power module claim 8, further comprising a base plate to which the normally-on semiconductor switches are bonded and a top plate to which for each normally-on semiconductor switch an electrically conducting spring element is attached, which presses against the respective normally-on semiconductor switch.

10. The power module of claim 1,
wherein the normally-on semiconductor switches are based on a SiC substrate;
wherein the normally-on semiconductor switches are JFETs.

11. The power module of claim 1,
wherein the balancing semiconductor switch is a normally-off semiconductor switch.

12. The power module of claim 1,
wherein the balancing semiconductor switch is based on a Si substrate;
wherein the balancing semiconductor switch is an IGBT, a MOSFET or a JFET.

13. The power module of claim 1,
wherein the normally-on semiconductor switches comprises gates, all of which gates are electrically connected with each other for receiving a single gate signal from the controller.

14. The power module of claim 1, further comprising:
a base plate to which the normally-on semiconductor switches are bonded and a top plate to which for each normally-on semiconductor switch an electrically conducting spring element is attached, which presses against the respective normally-on semiconductor switch.

15. The power module of claim 1, further comprising:
an auxiliary unit for providing auxiliary power to the controller,
wherein the auxiliary unit comprises a battery for providing power to the controller in the case of a stark-up of the power module.

16. The power module of claim 1, further comprising:
an auxiliary unit for providing auxiliary power to the controller,
wherein the auxiliary unit comprises an inductive power supply for providing power to the controller in the case of a start-up of the power module.

17. A power module stack, comprising:
at least two power modules according to claim 1 connected in series.

18. A method for controlling a power module, the power module comprising a plurality of normally-on semiconductor switches based on a wide bandgap substrate, the normally-on semiconductor switches connected in parallel; a balancing unit comprising a capacitor and a balancing semiconductor switch connected in series, which are connected in parallel to the normally-on semiconductor switches; a controller adapted for providing a gate signal for the normally-on semiconductor switches and for providing a gate signal for the balancing semiconductor switch; wherein the controller is adapted for turning the normally-on semiconductor switches on and off with a given switching frequency; the method comprising:
turning the normally-on semiconductor switches on and off with a given switching frequency;
turning off the balancing semiconductor switch, when the normally-on semiconductor switches are turned on and turning on the balancing semiconductor switch, when the normally-on semiconductor switches are turned off.

* * * * *